United States Patent
Zhong et al.

(10) Patent No.: US 8,513,742 B2
(45) Date of Patent: Aug. 20, 2013

(54) METHOD FOR MANUFACTURING CONTACT AND SEMICONDUCTOR DEVICE HAVING SAID CONTACT

(75) Inventors: Huicai Zhong, Beijing (CN); Qingqing Liang, Beijing (CN)

(73) Assignee: Institute of Microelectronics, Chinese Academy of Science, Beijing (CN)

( * ) Notice: Subject to any disclaimer, the term of this patent is extended or adjusted under 35 U.S.C. 154(b) by 55 days.

(21) Appl. No.: 13/144,887

(22) PCT Filed: Feb. 27, 2011

(86) PCT No.: PCT/CN2011/071355
§ 371 (c)(1),
(2), (4) Date: Jul. 15, 2011

(87) PCT Pub. No.: WO2011/160467
PCT Pub. Date: Dec. 29, 2011

(65) Prior Publication Data
US 2012/0223398 A1    Sep. 6, 2012

(30) Foreign Application Priority Data
Jun. 22, 2010  (CN) .......................... 2010 1 0215164

(51) Int. Cl.
*H01L 27/088* (2006.01)
(52) U.S. Cl.
USPC .......................... 257/382; 257/384; 257/401
(58) Field of Classification Search
USPC .......................................... 257/382, 384, 401
See application file for complete search history.

(56) References Cited

U.S. PATENT DOCUMENTS

| | | | |
|---|---|---|---|
| 4,833,519 A | | 5/1989 | Kawano et al. |
| 5,231,052 A | * | 7/1993 | Lu et al. ......................... 438/643 |
| 5,420,074 A | * | 5/1995 | Ohshima ....................... 438/620 |
| 5,472,912 A | * | 12/1995 | Miller ............................ 438/643 |
| 5,479,053 A | * | 12/1995 | Oda .............................. 257/750 |
| 5,502,335 A | * | 3/1996 | Oda .............................. 257/751 |
| 5,523,624 A | * | 6/1996 | Chen et al. .................... 257/751 |
| 5,582,971 A | * | 12/1996 | Chen et al. .................... 438/643 |

(Continued)

FOREIGN PATENT DOCUMENTS

| | | |
|---|---|---|
| CN | 101101890 | 1/2008 |
| JP | 62281467 | 12/1987 |
| KR | 20030097493 | 12/2003 |
| TW | 536732 | 6/2003 |

OTHER PUBLICATIONS

International Written Opinion Report dated Jun. 22, 2011, for corresponding application PCT/CN2011/071355.

(Continued)

*Primary Examiner* — Ngan Ngo
(74) *Attorney, Agent, or Firm* — Alston & Bird LLP

(57) ABSTRACT

The present invention relates to a method for manufacturing a contact and a semiconductor device having said contact. The present invention proposes to form first a trench contract of relatively large size, then to form one or more dielectric layer(s) within the trench contact, and then to remove the upper part of the dielectric layer(s) and to fill the same with a conductive material. The use of such a method makes it easy to form a trench contact of relatively large size which is easy for manufacturing; besides, since dielectric layer(s) is/are formed in the trench contact, thence capacitance between a source/drain trench contact and a gate electrode is reduced accordingly.

7 Claims, 7 Drawing Sheets

(56) References Cited

U.S. PATENT DOCUMENTS

| | | | |
|---|---|---|---|
| 5,592,023 A * | 1/1997 | Oda | 257/750 |
| 2003/0008498 A1 | 1/2003 | Nakata | |
| 2007/0298600 A1 | 12/2007 | Suh et al. | |
| 2010/0164603 A1 * | 7/2010 | Hafez et al. | 327/525 |
| 2011/0204437 A1 * | 8/2011 | Matsunaga | 257/330 |

OTHER PUBLICATIONS

International Search Report dated Jun. 22, 2011, for corresponding application PCT/CN2011/071355.

* cited by examiner

METHOD FOR MANUFACTURING CONTACT AND SEMICONDUCTOR DEVICE HAVING SAID CONTACT

CROSS REFERENCE TO RELATED APPLICATION

This application is a national stage application, filed under 35 U.S.C. §371, of International Application No, PCT/CN2011/071355, filed Feb. 27, 2011, which claims the priority of Chinese Patent Application No. 201010215164.8, filed Jun. 22, 2010, all of which are hereby incorporated by reference in their entirety.

FIELD OF THE INVENTION

The present invention generally relates to a method for manufacturing a trench contact structure and a semiconductor device, and particularly, relates to a method for manufacturing a contact structure capable of reducing capacitance between a trench contact and a gate electrode, and to a semiconductor device having such a trench contact structure.

BACKGROUND OF THE INVENTION

With the development of the semiconductor technology, integrated circuits with better performance and more powerful functions require greater device integration density. Thus, the sizes of the components need to be scaled further. Particularly, with continual scaling of the feature sizes, it becomes more difficult to manufacture contact holes which are used to connect gates and source/drain between devices, and defects existing in the process for manufacturing contact holes will seriously affect yield of products. Although there is another type of trench contact of relatively large size which makes it easier for performing such contact manufacturing processes as patterning and filling and also provides a relatively large contact area, the trench contact with a large contact area will significantly increase capacitance between the trench contact and the gate electrode as scaling down of the feature size of device, thereby impairing performance of devices.

Accordingly, there is a need to propose a method for manufacturing a trench contact structure, which has a large contact area but is capable of reducing capacitance between a trench contact and a gate electrode, and a semiconductor device having such a trench contact structure.

SUMMARY OF THE INVENTION

The present invention provides a semiconductor device with a trench contact structure, comprising: a semiconductor substrate; a gate stack formed on the semiconductor substrate, source/drain regions within the semiconductor substrate, wherein the gate stack comprises a gate electrode and a gate dielectric layer; source/drain contacts formed on the source/drain regions, and a gate contact formed on the gate electrode; wherein the source/drain contacts comprise: a trench contact, and a dielectric layer and a conductive layer formed within the trench contact, wherein the conductive layer is positioned on the dielectric layer which is not in contact with a layer under the trench contact. Preferably, the gate contact has the same structure as that of the drain contact, and comprises: a trench contact, a dielectric layer and a conductive layer formed within the trench contact, wherein the conductive layer is positioned on the dielectric layer which is not in contact with a layer under the trench contact. Wherein, the material for forming the dielectric layers is a low-k dielectric material, $SiO_2$ or a nitride material. The material for forming the conductive layers is a conductive material.

The present invention further provides a method for manufacturing a trench contact structure, comprising: providing a semiconductor substrate and a semiconductor device, wherein the semiconductor device comprises a gate stack positioned on the semiconductor substrate and source/drain regions within the semiconductor substrate, and the gate stack comprises a gate electrode and a gate dielectric layer; forming a trench contact on the source/drain regions; forming, within the trench contact, an opening which does not expose a layer under the trench contact; forming a dielectric layer within the opening, and forming a conductive layer on the dielectric layer to completely fill the opening, so as to form a contact structure with a dielectric layer in the trench contact. Preferably, a gate contact or a trench contact is formed on the gate electrode at the same time of forming the trench contact on the source/drain regions. Wherein, the material for forming the dielectric layer is a low-k dielectric material, $SiO_2$ or a nitride material. The material for forming the conductive layer is a conductive material. The number of the opening(s) may be one or more.

According to the method of the present invention, a trench contact of a relatively large size serves as a contact, and one or more dielectric layer(s) is/are formed within the trench contact. Thus, such a structure significantly increases a contact area and also effectively reduces capacitance between a trench contact and a gate electrode accordingly.

DETAILED DESCRIPTION OF THE INVENTION

The present invention generally relates to a method for manufacturing a trench contact structure and a semiconductor device. The following disclosure provides a plurality of different embodiments or examples to achieve different structures of the present invention. To simplify the disclosure of the present invention, description of the components and arrangements of specific examples is given below. Of course, they are only illustrative and not limiting the present invention. Moreover, in the present invention, reference numbers and/or letters may be repeated in different embodiments. Such repetition is for the purposes of simplification and clarity, and does not denote the relationship between respective embodiments and/or arrangements being discussed. In addition, the present invention provides various examples for specific processes and materials. However, it is obvious for a person of ordinary skill in the art that other processes and/or materials may alternatively be utilized. Furthermore, the following structure in which a first object is "on" a second object may include an embodiment in which the first object and the second object are formed to be in direct contact with each other, and may also include an embodiment in which another object is formed between the first object and the second object such that the first and second objects might not be in direct contact with each other.

It is necessary to specify that the respective embodiments described below may be included in the formation process of integrated circuits or in a part thereof, may comprise Static Random Access Memory (SRAM) and/or other logic circuit(s), passive elements such as resistor(s), capacitor(s) and inductor(s), and active elements such as P-channel field effect transistors (PFETs), N-channel field effect transistors (NFETs), metal oxide semiconductor field effect transistors (MOSFETs), complementary metal oxide semiconductor (CMOS) transistors, bipolar transistors, high voltage transistors, high frequency transistors, other memory units, and any combination thereof and/or other semiconductor devices. A CMOS structure is taken as an example in the description of the respective embodiments of the present invention, while other structures, which are also applicable for the respective embodiments of the present invention, are omitted here in order not to obscure the invention.

Figure 1:
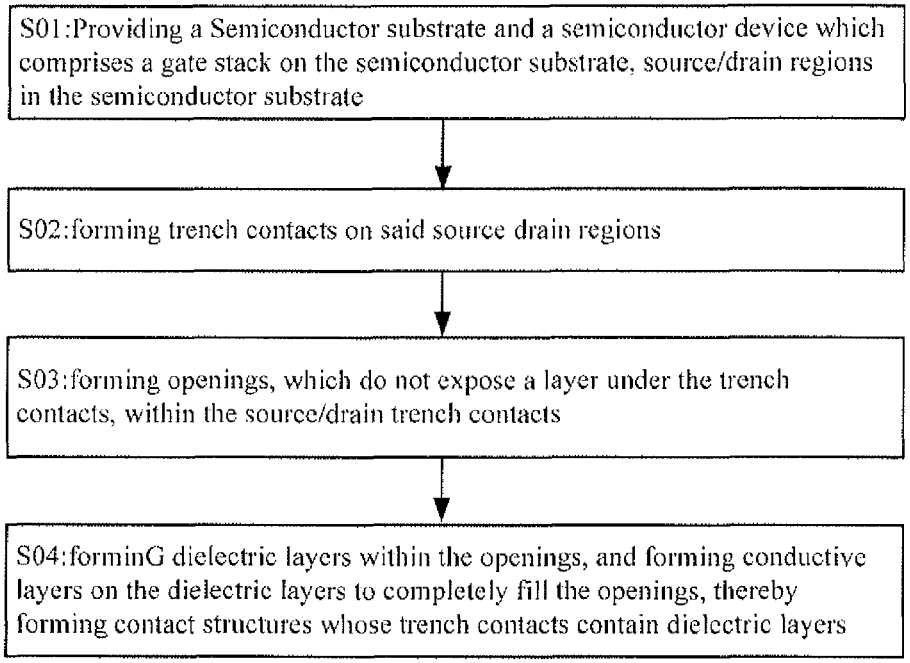
FIG. 1 is a flowchart of a method for manufacturing source/drain contacts according to an embodiment of the present invention.
Figure 2:
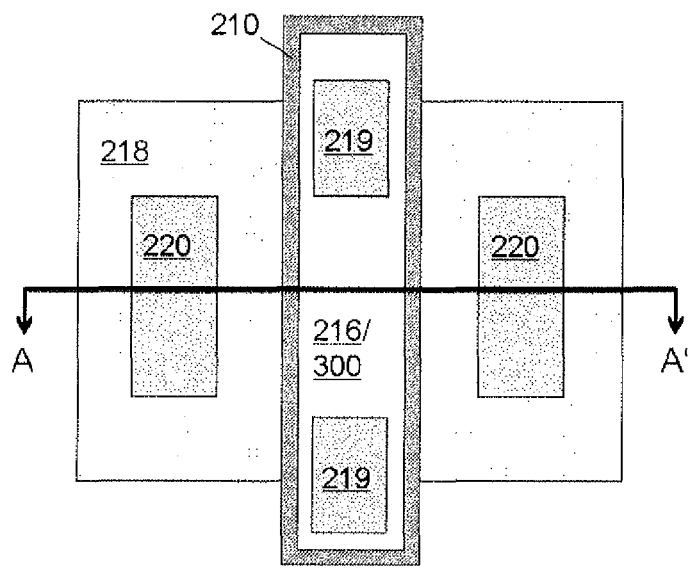
FIG. 2, FIG. 2A, FIG. 3, FIG. 3B, FIG. 4, FIG. 4B, FIG. 5, FIG. 5B, FIG. 6, FIG. 6B, FIG. 7 and FIG. 7B illustrate top down views, cross-section views along A-A' and B-B' direction of the respective manufacturing stages of source/drain contacts according to an embodiment of the present invention.

With reference to FIG. 1, FIG. 1 is a flowchart of a method for manufacturing source/drain contacts according to an embodiment of the present invention. In step S01, a semiconductor substrate 200 and a semiconductor device are provided, as shown in FIG. 2 (top down view) and FIG. 2A (A-A' direction cross-section view). It should be noted that an inter-level dielectric layer 218, which covers a metal silicide layer 216 and a gate stack 300, is not shown in all the top down views of the embodiments of the present invention, in order not to block the view of the semiconductor device structures of the embodiments of the present invention and other embodiments having structures of the embodiments of the present invention, such that the embodiments of the present invention are described and specified more clearly. This step precedes the step of forming a semiconductor device with a trench contact structure. The formation of the semiconductor device may be performed by any method, and thus the present invention does not set any limit on its structure, forming materials, forming steps and processes, etc. In an embodiment of the present invention, the device is formed with a gate stack 300, sidewall spacer(s) 210, source/drain regions 214, a metal silicide layer 216 and an inter-level dielectric layer 218.

The substrate 200 comprises a crystalline silicon substrate (for example, a chip), and may comprise other semiconductors or compound semiconductors, such as Ge, SiGe, GaAs, InP, SiC or diamond. According to the design specifications known in the prior art (for example, a p-type substrate or an n-type substrate), the substrate 200 may be of various doping configurations. Additionally, the substrate 200 may optionally comprise an epitaxial layer, may be manipulated by stress to enhance performance, and/or may comprise a SOI (silicon on insulator) structure.

Specifically, a gate stack 300 is formed firstly on the substrate 200. The gate stack 300 typically comprises a gate dielectric layer and a gate electrode situated thereon. The gate dielectric layer may be $SiO_2$ and high-K dielectric materials (for example, a material with higher dielectric constant than $SiO_2$). The examples of the high-K dielectric materials may comprise such as Hf based materials. An interfacial layer may be formed between the gate dielectric layer and the substrate 200, such as $SiO_2$ or the like. The gate electrode may be in a single-layer or multilayer structure, and may comprise metals, metal compounds, polysilicon and any combination thereof. The gate stack 300 may be formed by means of sputtering, PVD, MOCVD, ALD, PEALD or other appropriate processes. After the formation of the gate stack 300, sidewall spacers 210 are usually formed on its side walls. The sidewall spacers 210 may be formed by silicon nitride, silicon dioxide, siliconoxynitride, silicon carbide, fluorine-doped silicate glass, low-K dielectric materials, and/or other materials as appropriate and any combination thereof, and the sidewall spacers 210 may have a multilayer structure.

Next, source/drain regions 214 are formed, and they may be formed by way of implanting p-type or n-type dopants or impurity into the substrate 200 according to the structure of a desired transistor. The source/drain regions 214 may be formed by means of processes including lithography, ion implantation, diffusion and/or other processes as appropriate. Then annealing process is performed to the source/drain regions 214 in order to activate the dopants. Particularly, source/drain shallow junction regions 212 may be formed prior to the formation of the source/drain regions 214. The source/drain shallow junction regions 212 typically comprise source/drain extension regions and/or halo regions.

Preferably, in an embodiment of a silicon substrate, a metal silicide layer 216 may be formed after the formation of source/drain regions 214. The formation of the metal silicide layer 216 may be a self-aligned formation of a metal silicide layer, wherein a metal material, for example, Co, Ni, Mo, Pt and W or the like, is deposited on the device, then annealing process is performed so that the metal reacts with any silicon surface in contact therewith so as to form a metal silicide. The silicon surface is usually the semiconductor substrate 200 where the source/drain regions 214 are located and the polysilicon layer of the gate electrode in the gate stack 300. Then, the unreacted metals are removed so as to form a self-aligned metal silicide layer 216. In an embodiment where the substrate material is a semiconductor material such as InP, GaAs or the like, after silicided source/drain regions 214 are formed, a conductive material contact layer (not shown) may be formed thereon so as to reduce contact resistance, Then, an inter-level dielectric layer 218 is formed, wherein the inter-level dielectric layer 218 may be, but not limited to, for example, undoped silicon dioxide ($SiO_2$), doped silicon oxide (for example, borosilicate glass, borophosphosilicate glass, etc.) and silicon nitride ($Si_3N_4$). The inter-level dielectric layer 218 may be formed by means of methods such as Chemical Vapor Deposition (CVD), Physical Vapor Deposition (PVD), Atom Layer Deposition (ALD), and/or other processes as appropriate. The inter-level dielectric layer may be a multilayer structure.

Figure 2A:
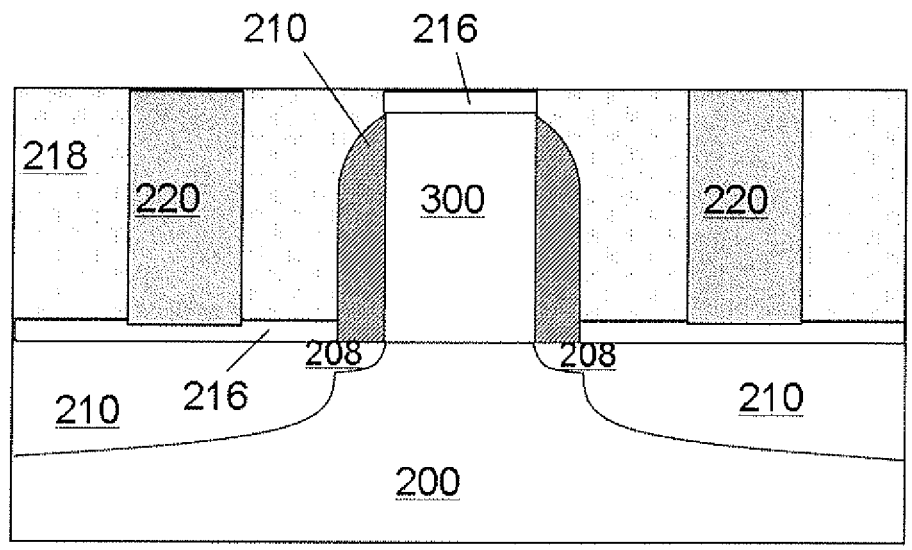

In step S02, source/drain trench contacts 220 are formed on the source/drain regions 214, as shown in FIG. 2 (top down view) and FIG. 2A (A-A' direction cross-section view). In an embodiment, a mask is formed on the inter-level dielectric layer 218, and some portions of the inter-level dielectric layer 218 are removed by way of dry etching to expose the metal silicide layer 216 on the source/drain regions 214. so as to form a trench. Then, the mask is removed, and a conductive material, for example, metal W or the like, is deposited and then planarized so as to form the source/drain trench contacts 220 which are achieved by filling conductive materials. In another embodiment, the trench contacts may be formed by means of other methods such as formation of self-aligned metal sidewall spacers. Meanwhile, it is also possible to form a trench contact on the gate electrode in the gate stack 300, or on the metal silicide layer 216 of the gate electrode in the gate stack 300 in the case that the top layer of the gate electrode is polysilicon, so as to form a gate contact 219 comprising the trench contact. The gate contact 219 may have a structure either the same as or different from the structure of source/drain contacts which are to be formed later.

Figure 3:
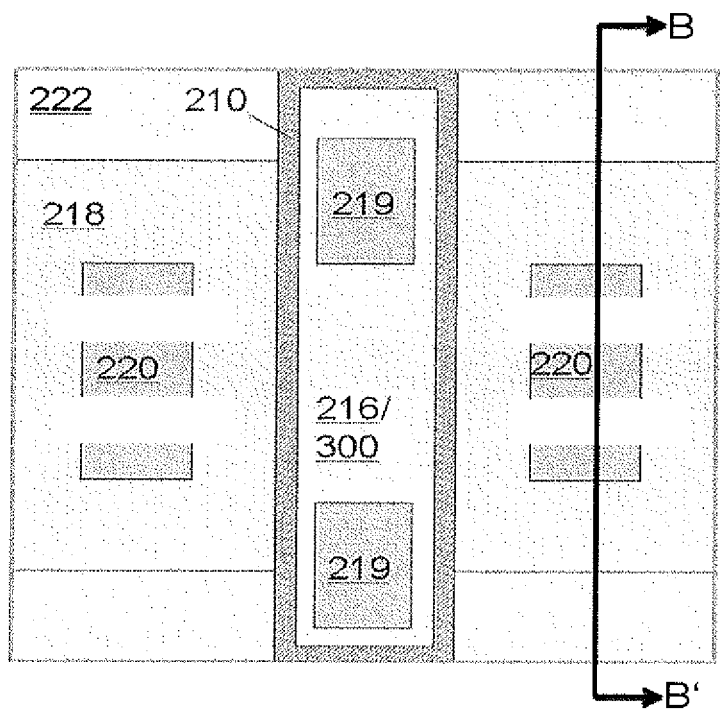
Figure 3B:
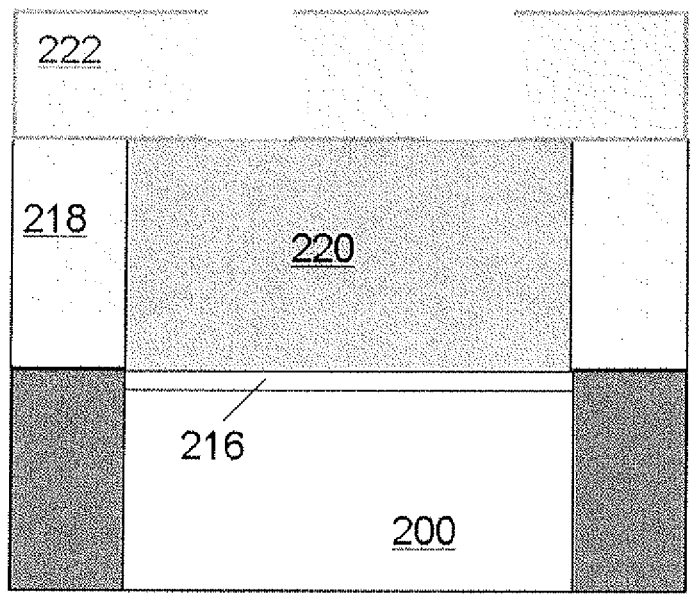
Figure 4:
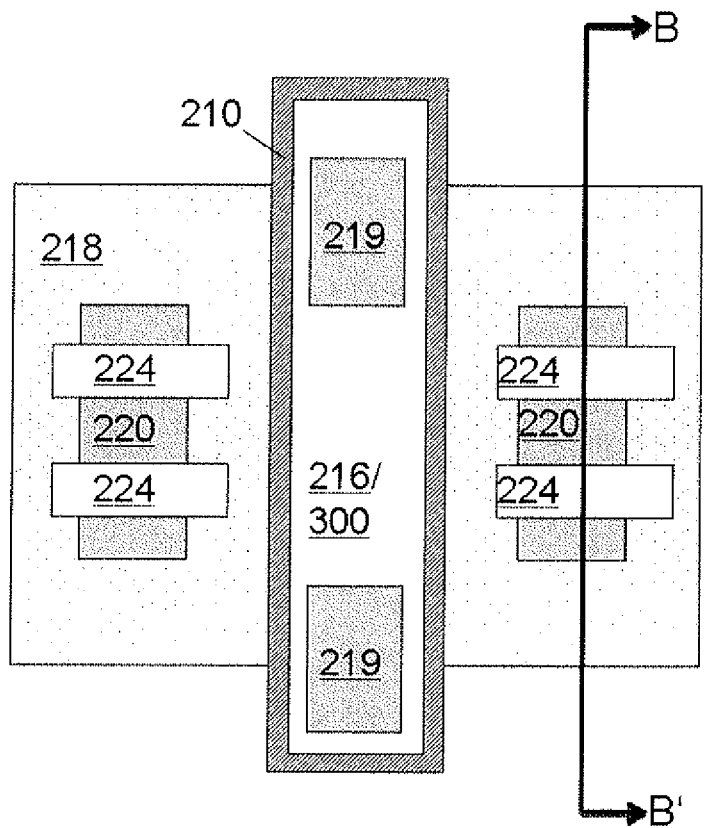
Figure 4B:
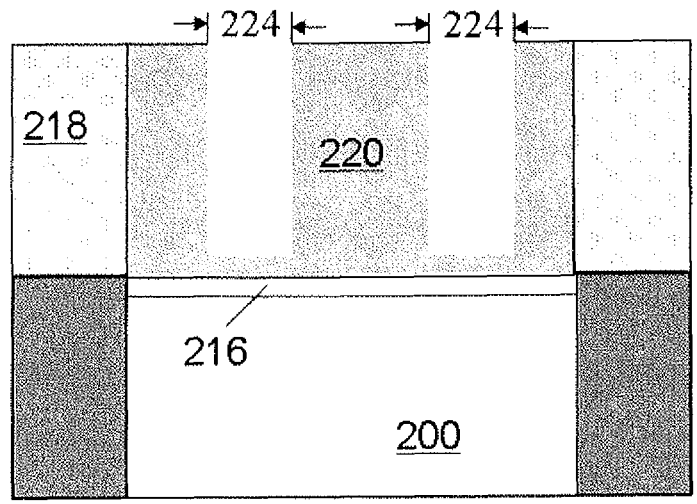

In step S03, an opening 224, in which the metal silicide layer 216 under the trench contact is not exposed, is formed within the source/drain trench contacts 220, as shown in FIG. 4 (top down view) and FIG. 4B (B-B' direction cross-section view). First, a mask layer 222 such as a photo resist layer may be formed to cover the device. The portion which is not covered by the mask layer 222 corresponds to the portion to be removed to form the opening. In an embodiment, the gate contact 219 is partially covered by the mask layer 222, as shown in FIG. 3 (top down view) and FIG. 313 (B-B' direction cross-section view). In this embodiment, the gate contact has a structure different from that of the source/drain contacts, and the embodiment is described in the present invention for illustrative purpose only. In another embodiment, the gate contact 219 is not covered by the mask layers 222, the gate contact may be formed together with the source/drain contacts, the gate contact may have the same structure as that of the source/drain contacts, and its formation and structure may refer to the formation of the source/drain contacts and are not shown in the drawings. Then, the portion of the trench contact 220 which is not covered by the mask layer 222 (in one embodiment, this portion may be the trench contact on the source/drain regions, and in another embodiment, this portion may be the trench contacts on the source/drain regions and the gate electrode) is removed by means of dry etching technique, for example, Reactive Ion Etching (RIE), so as to form the opening 224 in which the layer under the trench contact such as the metal suicide layer 216 is not exposed. The number of the opening(s) 224 may be one or more, preferably 2. Then, the mask layer 222 is removed so as to form a structure illustrated in FIG. 4B (B-B' direction cross-section view).

Figure 7:
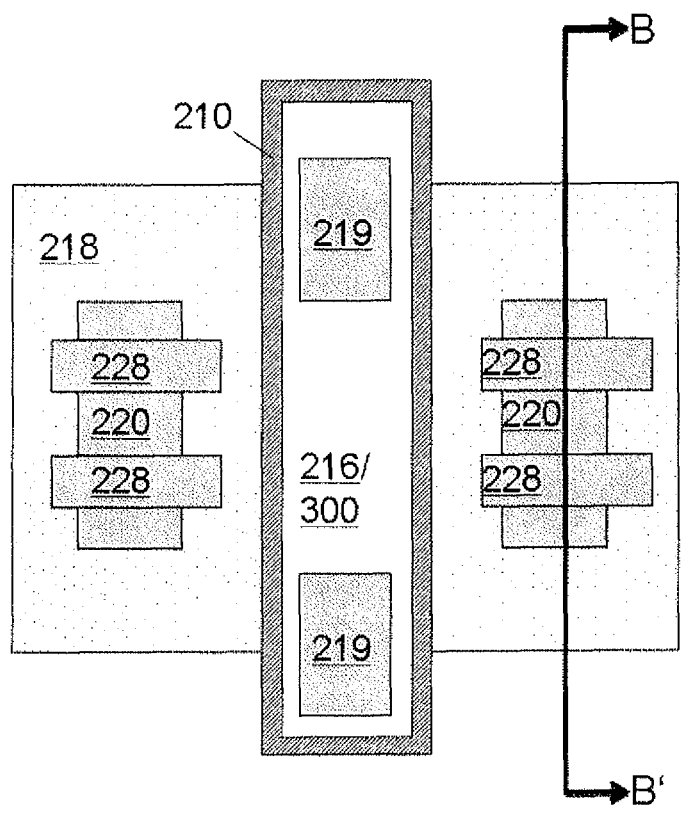
Figure 7B:
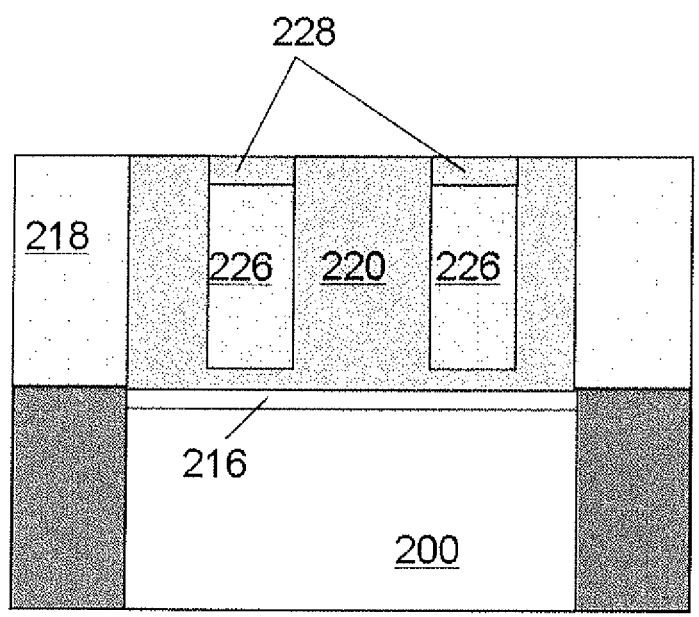

In step S04, a dielectric layer 226 is formed within the opening 224, and a conductive layer 228 is formed on the dielectric layer 226 so as to completely fill up the opening 224, thereby forming a trench contact structure with the dielectric layer 226 in the trench contact 220, as shown in FIG. 7 (top down view) and FIG. 7B (B-B' direction cross-section view).

Figure 5:
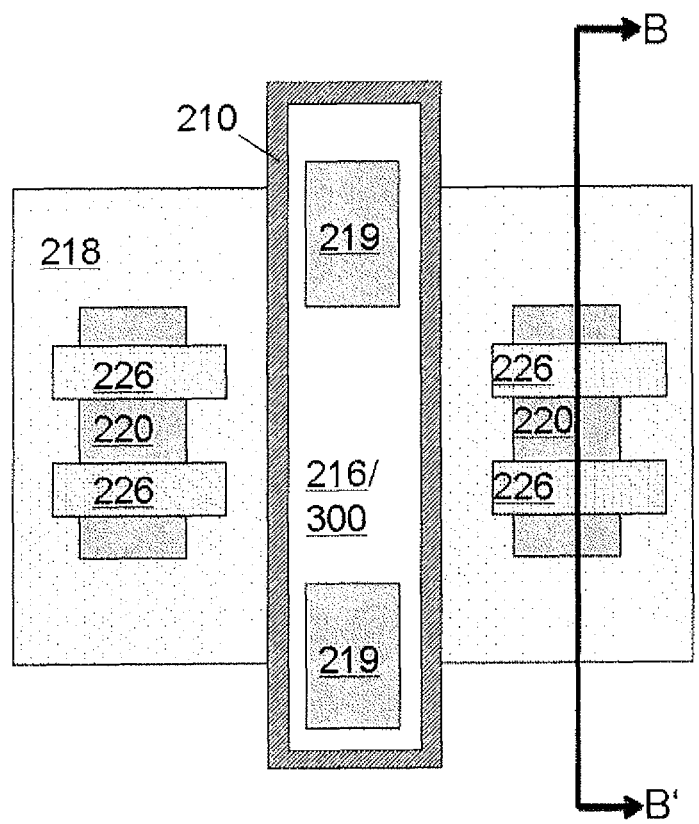
Figure 5B:
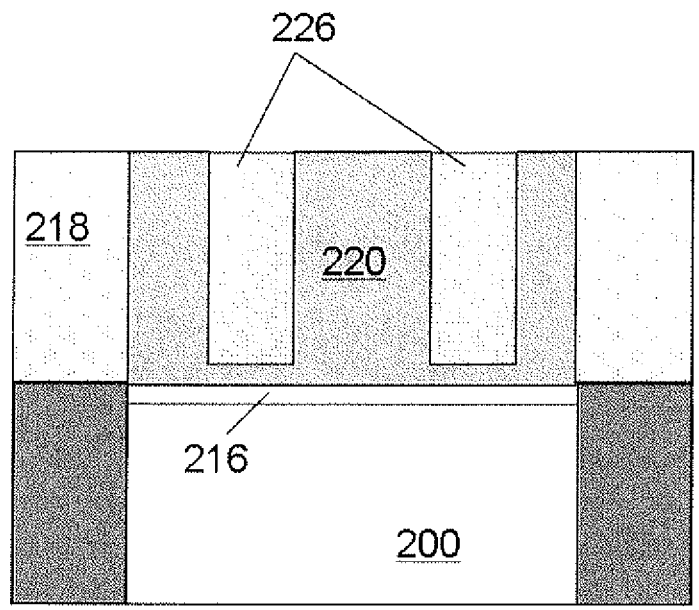

Specifically, first, a dielectric material, which may be a low-K dielectric material, such as $SiO_2$ or a nitride material, is deposited on the device and is planarized by means of such as Chemical Mechanical Polishing (CMP) to expose the inter-level layer 218, so as to form a dialectic layer 226 which completely fill up the opening 224, as shown in FIG. 5 (top down view) and FIG. 5B (B-B' direction cross-section view).

Figure 6:
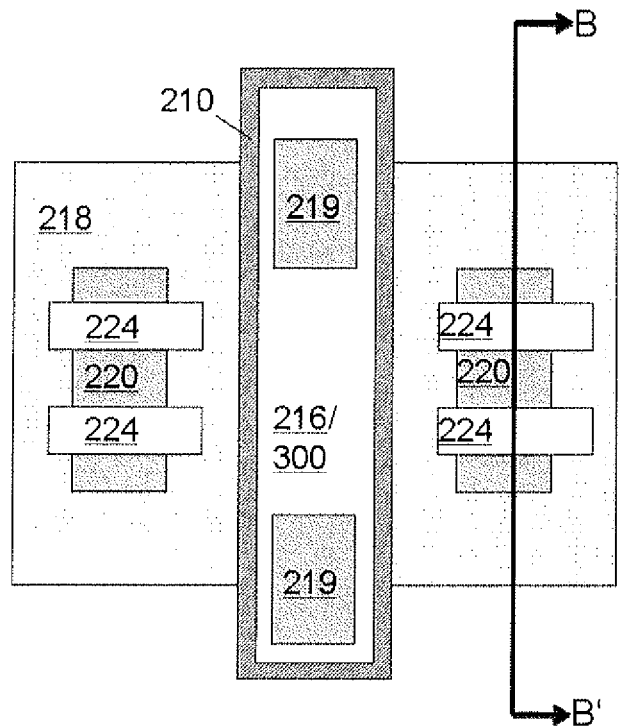
Figure 6B:
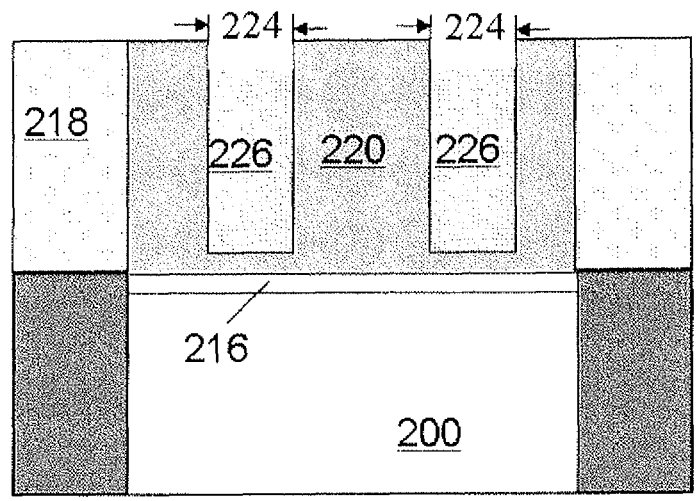

Next, the portion of the dielectric layer 226 which is located at the upper part of the opening 224 is selectively removed by an etching process such as drying etching, and preferably by wet etching, as shown in FIG. 6 (top down view) and FIG. 6B (B-B' direction cross-section view).

Finally, a conductive material such as metal W or the like is deposited on the device and is planarized by means of such as Chemical Mechanical Polishing (CMP) to expose the inter-level dielectric layer 218, so as to fill part of the opening 224, from which the dielectric layer 226 has been removed, with the conductive material, as shown in FIG. 7 (top down view) and FIG. 713 (B-B' direction cross-section view), thereby forming a trench contact structure whose trench contact 220 contains the dielectric layer 226.

According to the aforesaid method, the present invention further provides a semiconductor device with such a trench contact structure, comprising: a semiconductor substrate 200; a gate stack 300 formed on the semiconductor substrate 200, source/drain regions 214 in the semiconductor substrate 200, wherein the gate stack 300 comprises a gate electrode and a gate dielectric layer; source/drain contacts formed on the source/drain regions; and a gate contact 219 formed on the gate electrode, wherein the source/drain contact comprises: a trench contact 220, a dielectric layer 226 and a conductive layer 228 which are formed within the trench contact 220, wherein the conductive layer 228 is positioned on the dielectric layer 226 which is not in contact with a layer under the trench contact 220. Preferably, the gate contact 219, which has the same structure as that of the source/drain contacts, comprises: a trench contact, a dielectric layer and a conductive layer which are formed within said trench contact, wherein the conductive layer is positioned on the dielectric layer which is not in contact with a layer under the trench contact. The dielectric layer 226 may be of at least one of low-K dielectric materials, $SiO_2$ and a nitride material. The conductive layer 228 may be of conductive materials. Preferably, a metal silicide layer or a conductive material contact layer may be further formed on the semiconductor substrate at the source/drain regions so as to reduce contact resistance.

In the method according to the present invention, a trench contact of relatively large size is formed firstly, then one or more dielectric layer(s) are formed within said trench contact, and finally the upper part(s) of the dielectric layer(s) are removed and a conductive material is filled therein. In such a method, it is easy to form firstly a trench contact of relatively large size which is easy for manufacturing and has a relatively large contact area. In addition, since dielectric layer(s) is/are formed within the trench contact, capacitance between the gate electrode and the source/drain trench contacts is reduced accordingly.

Although the embodiments and their advantages have been described in detail, it is readily apparent to those having ordinary skill in the art that various alterations, substitutions and modifications may be made to the embodiments without departing from the spirit of the present invention and the scope as defined by the appended claims. For other examples, it may be easily recognized by a person of ordinary skill in the art that the order of the process steps may be changed without departing from the scope of the present invention.

In addition, the scope to which the present invention is applied is not limited to the process, mechanism, manufacture, material composition, means, methods and steps described in the specific embodiments in the specification. A person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A semiconductor device having a trench contact structure, comprising:
   a semiconductor substrate;
   a gate stack formed on the semiconductor substrate, wherein the gate stack comprises a gate electrode and a gate dielectric layer;
   source/drain regions in the semiconductor substrate;
   source/drain contacts formed on the source/drain regions, and
   a gate contact formed on the gate electrode;
   wherein the source/drain contact comprises: a first trench contact, a first dielectric layer and a first conductive layer which are formed within the first trench contact, wherein the first conductive layer is positioned on the first dielectric layer which is not in contact with a layer under the first trench contact, wherein the first dielectric layer traverses the first trench contact in a channel direction, and the first dielectric layer is at least partially surrounded by the first conductive layer in a direction transverse to the channel direction.

2. The semiconductor device according to claim 1, wherein the gate contact comprises: a second trench contact, a second dielectric layer and a second conductive layer which are formed within said second trench contact, and wherein the second conductive layer is positioned on the second dielectric layer which is not in contact with a layer under the second trench contact.

3. The semiconductor device according to claim 1, wherein the first dielectric layer is formed of at least one of a low-K dielectric material, $SiO_2$ and a nitride material.

4. The semiconductor device according to claim 1, wherein the first conductive layer is formed of a conductive material.

5. The semiconductor device according to claim 1, further comprising a metal silicide layer or a conductive material contact layer respectively formed on the semiconductor substrate of the source/drain regions and on the gate electrode.

6. The semiconductor device according to claim 2, wherein the second dielectric layer is formed of at least one of a low-K dielectric material, $SiO_2$ and a nitride material.

7. The semiconductor device according to claim 2, wherein the second conductive layer is formed of a conductive material.

* * * * *

UNITED STATES PATENT AND TRADEMARK OFFICE
CERTIFICATE OF CORRECTION

PATENT NO. : 8,513,742 B2
APPLICATION NO. : 13/144887
DATED : August 20, 2013
INVENTOR(S) : Zhong et al.

It is certified that error appears in the above-identified patent and that said Letters Patent is hereby corrected as shown below:

Title Page
"(73) Assignee: Institute of Microelectronics, Chinese Academy of Science, Beijing (CN)"
should read --(73) Assignee: Institute of Microelectronics, Chinese Academy of Sciences, Beijing (CN)--

Signed and Sealed this
Twenty-second Day of October, 2013

Teresa Stanek Rea
*Deputy Director of the United States Patent and Trademark Office*